United States Patent
Lin et al.

(10) Patent No.: US 7,688,928 B2
(45) Date of Patent: Mar. 30, 2010

(54) DUTY CYCLE COUNTING PHASE CALIBRATION SCHEME OF AN INPUT/OUTPUT (I/O) INTERFACE

(75) Inventors: Cathy Ye Lin, San Jose, CA (US);
Freeman Zhong, San Ramon, CA (US);
Catherine Chow, San Jose, CA (US); Yi Zeng, Fremont, CA (US); Ryan Park, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 843 days.

(21) Appl. No.: 11/516,382

(22) Filed: Sep. 5, 2006

(65) Prior Publication Data

US 2008/0070537 A1    Mar. 20, 2008

(51) Int. Cl.
*H03D 3/24* (2006.01)
(52) U.S. Cl. ........................................... 375/376
(58) Field of Classification Search ............... 375/376
See application file for complete search history.

(56) References Cited

U.S. PATENT DOCUMENTS

| | | | | |
|---|---|---|---|---|
| 5,400,370 A | * | 3/1995 | Guo ......................... | 375/371 |
| 5,889,436 A | * | 3/1999 | Yeung et al. ................ | 331/2 |
| 5,953,284 A | * | 9/1999 | Baker et al. ................ | 365/233.1 |
| 6,172,711 B1 | * | 1/2001 | Masumoto et al. ........... | 348/536 |
| 6,304,115 B1 | * | 10/2001 | Beaulieu ..................... | 327/156 |
| 6,563,888 B1 | * | 5/2003 | Toriyama .................... | 375/340 |
| 6,720,815 B2 | * | 4/2004 | Mizuno ....................... | 327/295 |
| 6,731,667 B1 | * | 5/2004 | Lee et al. .................... | 375/130 |
| 6,891,417 B2 | * | 5/2005 | Khondker et al. ............. | 327/165 |
| 7,436,227 B2 | * | 10/2008 | Thomsen et al. .............. | 327/147 |
| 7,486,120 B2 | * | 2/2009 | Kubo .......................... | 327/158 |
| 2005/0129158 A1 | * | 6/2005 | Kuwata ....................... | 375/376 |

\* cited by examiner

*Primary Examiner*—Juan A Torres
(74) *Attorney, Agent, or Firm*—Raj Abhyanker, LLP

(57) ABSTRACT

In one embodiment a control unit of a communication system exchanging a multiple-phase time-interleaved data includes a first Phase-Locked Loop (PLL) to generate a set of un-calibrated multiple-phase signals of a first-clock; a second-PLL, a pulse generator, a pulse-width measurement unit and a phase calibration engine to evaluate adjustments required in a temporal location of a logically critical voltage transition edge in each signal in the un-calibrated set; and a phase adjustment unit to adjust the temporal location of the logically critical voltage transition edge in each signal in the un-calibrated set to generate a set of calibrated multiple-phase signals of the first-clock such that each signal in the calibrated set includes the logically critical voltage transition edge which is time skewed in a predetermined amount from the logically critical voltage transition edge in other signals in the same set within a predetermined accuracy.

20 Claims, 8 Drawing Sheets

DUTY CYCLE COUNTING PHASE CALIBRATION SCHEME OF AN INPUT/OUTPUT (I/O) INTERFACE

FIELD OF TECHNOLOGY

This disclosure relates generally to the technical fields of electronics and integrated circuit (IC) technology and, in one example embodiment, to a method, apparatus and/or system of a data transceiver and/or a data communication system having a phase calibration scheme.

BACKGROUND

A communication system (e.g. a system including a transmitter, a receiver and a communicating channel) may handle a large number of bits of data exchange (e.g. gigabits or terabits) per second over several thousands of miles of distance. As communication systems may become more popular (e.g. cell phone, internet, inter-chip or intra-chip communication systems), communication systems with lower cost, smaller size and higher data efficiency may appear in market.

The transmitter and the receiver of the communication system, may need to match their operating characteristics (e.g. synchronize a frequency and/or a phase of a clock) to reliably process (e.g. to reduce a number of faulty bits in a processed data per million bits of a received data stream) an exchanged data stream. For example, in the case of baseband data transmissions, the transmitter may generate the clock signal to control the flow of a transmitted data and the receiver may generate another clock signal with matching characteristics (e.g. the frequency and the phase) to sample the received data at such temporal locations that may produce an optimal data recovery.

The receiver and the transmitter may need to exchange a predetermined pattern of data so that the transmitter and receiver may synchronize their clock signals. Inherent errors in the communication channel (e.g. noise) may create problems in such a scheme. Such a scheme may be difficult to implement and may increase number of components, area, power consumption and cost of the system. Dissimilar synchronization logic in the transmitter and the receiver in a transceiver may further complicate the design and increase the cost.

In future, a rate of data communication between the transmitter and the receiver may increase (e.g. gigabits per second). This may happen because a data processing component (e.g. a Central Processing Unit (CPU)) may be able to process or generate data at a faster rate. Or this may also happen because of the development of a data memory system (e.g. a hard disk) that may need to communicate a high density of data to the data processing unit within a reasonable amount of time.

At the higher rate of received data signal it may be difficult to effectively control data sampling process in the receiver. For example, semiconductor circuits, such as complementary metal oxide semiconductor (CMOS) circuits, may be unable to operate at a sufficiently high frequency to optimally sample the received data stream.

In a time-interleaved design (e.g. multiple slower sampling circuits may operate in parallel in a time skewed fashion to simultaneously sample a high frequency data stream), although a slower sampling circuit may suffice, it may become important to precisely control the time skew (e.g. a phase noise) between time-interleaved units.

While the data rate may increase, a channel bandwidth may remain same. This may increase a distortion that a signal may suffer while propagating through the channel and may reduce the size of an eye opening (e.g. due to a inter-symbol-interference). At the higher rate of data communication, in abscence of a precision timing control technique it may not be possible to obtain and maintain an optimal sampling temporal location.

At the higher data rates it may also become difficult to distribute the clock over an entire integrated circuit (e.g. a transceiver) as the tolerance for a phase noise in the clock may reduce. The precision timing control technique may need to take into consideration all processes of the phase noise in the entire system. So, a precision timing control technique may become complex and may take finite amount of time which, in turn, may make it difficult to maintain overall high speed of data transfer.

SUMMARY

A method, apparatus and/or system of a duty cycle counting phase calibration scheme of an Input/Output (I/O) interface is disclosed. In one aspect a communication system includes a transmitter communicating a multiple-phase time-interleaved data with a predetermined data-symbol-rate with at least one receiver which includes a bank of data slicers and a data multiplexer coupled to a control unit; a first Phase-Locked Loop (PLL) of the control unit to generate a set of un-calibrated multiple-phase signals of a first-clock each with a predetermined repetition rate of the first-clock-frequency; a second-PLL, a pulse generator, a pulse-width measurement unit and a phase calibration engine of the control unit to evaluate adjustments required in a temporal location of a logically critical voltage transition edge in each signal in the set of un-calibrated multiple-phase signals of the first-clock; and a phase adjustment unit of the control unit to adjust the temporal location of the logically critical voltage transition edge in each signal in the set of un-calibrated multiple-phase signals of the first-clock to generate a set of calibrated multiple-phase signals of the first-clock to control the bank of data slicers and the data multiplexer of the receiver such that each signal in the set of calibrated multiple-phase signals of the first-clock includes the logically critical voltage transition edge which is time skewed in a predetermined amount from the logically critical voltage transition edge in other signals in the same set within a predetermined accuracy.

The system may further include the data-symbol-rate of 4 times the first-clock-frequency. The system may further include a second-clock generated by the second-PLL with a periodic repetition rate of second-clock-frequency which may be different from the first-clock-frequency in a predetermined amount of approximately 0.2%. The system may further use a plurality of time periods of the second-clock to evaluate a phase offset in each signal in the set of un-calibrated multiple-phase signals of the first-clock.

The system may further be such that the evaluation of adjustments required in the temporal location of the logically critical voltage transition edge in each signal in the set of un-calibrated multiple-phase signals of the first-clock may not depend on a received data stream. The system may further be such that a predetermined pattern in the received data stream may not be required to evaluate of adjustments in the temporal location of the logically critical voltage transition edge in each signal in the set of un-calibrated multiple-phase signals of the first-clock.

The system may further use an algorithm in the phase calibration engine in the receiver which may be substantially similar to an algorithm used is the transmitter.

The system may further be such that a phase offset caused by a voltage controlled oscillator, a clock tree and a phase interpolator may be adjusted by the control unit.

In another aspect a control unit includes a first-PLL to generate a set of un-calibrated multiple-phase signals of a first-clock such that each signal in the set of un-calibrated multiple-phase signals of the first-clock has a periodic repetition rate of a first-clock-frequency of the first-clock and includes a logically critical voltage transition edge; a second-PLL to generate a second-clock with a second-clock-frequency which is different from the first-clock-frequency in a predetermined amount; a pulse generator to logically combine the signals in the set of un-calibrated multiple-phase signals of the first-clock to generate a set of pulsed signals; a pulse-width measurement unit to measure a pulse width of the signals in the set of pulsed signals utilizing plurality of time periods the second-clock; a phase calibration engine to evaluate adjustments required in a temporal location of the logically critical voltage transition edge in each signal in the set of un-calibrated multiple-phase signals of the first-clock; and a phase adjustment unit to adjust the temporal location of the logically critical voltage transition edge in each signal in the set of un-calibrated multiple-phase signals of the first-clock to generate a set of calibrated multiple-phase signals of the first-clock such that each signal in the set of calibrated multiple-phase signals of the first-clock includes the logically critical voltage transition edge which is time skewed in a predetermined amount from the logically critical voltage transition edge in other signals in the same set within a predetermined accuracy.

The control unit may further be such that the first PLL may generates un-calibrated, approximately equally spaced, 4 phases of the first-clock each with the first-clock-frequency of 1.5 GHz. The control unit may further be such that the set of calibrated multiple-phase signals of the first-clock may be used to sample a received data stream at a repetition rate of 6 Gbps.

The control unit may further be such that the second-PLL may generate the second-clock with a time period of 62.25 ns which may be smaller as compared to the time period of the first-clock. The control unit may further use the plurality of time periods of the second-clock to sample and evaluate a waveform of each signal in the set of un-calibrated multiple-phase signals of the first-clock with a resolution of $256^{th}$ part of a time period of the first-clock.

The phase adjustment unit of the control may further include a set of 4 phase interpolator each adjusting the temporal location of the logically critical voltage transition edge in one of the 4 signals in the set of un-calibrated multiple-phase signals of the first-clock to one temporal location of a set of 64 possible temporal locations. The phase adjustment unit of the control unit may further be such that the set of 64 possible temporal locations may be substantially equally spaced within a quarter of a period of the first-clock.

In yet another aspect a method includes generating a set of un-calibrated multiple-phase signals of a first-clock using a first-PLL such that each signal in the set of un-calibrated multiple-phase signals of the first-clock has a periodic repetition rate of a first-clock-frequency of the first-clock and includes a logically critical voltage transition edge; generating a second-clock with a second-clock-frequency which is different from the first-clock-frequency in a predetermined amount using a second-PLL; generating a set of pulsed signals by logically combining the signals in the set of un-calibrated multiple-phase signals of the first-clock using a multiplexer and an AND gate of a pulse generator circuit; measuring a pulse width of the signals in the set of pulsed signals utilizing plurality of time periods the second-clock using a pulse width measurement unit; evaluating adjustments required in a temporal location of the logically critical voltage transition edge in each signal in the set of un-calibrated multiple-phase signals of the first-clock using a phase calibration engine; and generating a set of calibrated multiple-phase signals of the first-clock by adjusting the temporal location of the logically critical voltage transition edge in each signal in the set of un-calibrated multiple-phase signals of the first-clock such that each signal in the set of calibrated multiple-phase signals of the first-clock includes the logically critical voltage transition edge which is time skewed in a predetermined amount from the logically critical voltage transition edge in other signals in the same set within a predetermined accuracy using a phase adjustment unit.

The method may further use a plurality of time periods of the second-clock, which may be smaller than the time periods of the first-clock, to sample and evaluate a waveform of each signal in the set of un-calibrated multiple-phase signals of the first-clock to calculate a required phase adjustment in each signal in the set of un-calibrated multiple-phase signals of the first-clock.

The method may further be such that an evaluation of adjustments required in the temporal location of the logically critical voltage transition edge in each signal in the set of un-calibrated multiple-phase signals of the first-clock may not depend on a received data stream. The method of may further be such that the evaluation of adjustments required in the temporal location of the logically critical voltage transition edge in each signal in the set of un-calibrated multiple-phase signals of the first-clock may not require an exchange of a predetermined pattern of a data stream.

The method may further be such that an algorithm used in the phase calibration engine in the receiver may be substantially similar to an algorithm used in the transmitter.

The methods, systems, and apparatuses disclosed herein may be implemented in any means for achieving various aspects, and may be executed in a form of a machine-readable medium embodying a set of instructions that, when executed by a machine, cause the machine to perform any of the operations disclosed herein. Other features will be apparent from the accompanying drawings and from the detailed description that follows.

BRIEF DESCRIPTION OF THE DRAWINGS

Example embodiments are illustrated by way of example and not limitation in the figures of the accompanying drawings, in which like references indicate similar elements and in which.

Other features of the present embodiments will be apparent from the accompanying drawings and from the detailed description that follows.

DETAILED DESCRIPTION

A method, apparatus and/or system of a duty cycle counting phase calibration scheme of an I/O interface is disclosed. In the following description, for the purposes of explanation, numerous specific details are set forth in order to provide a thorough understanding of the various embodiments. It will be evident, however to one skilled in the art that the various embodiments may be practiced without these specific details.

Figure 1:
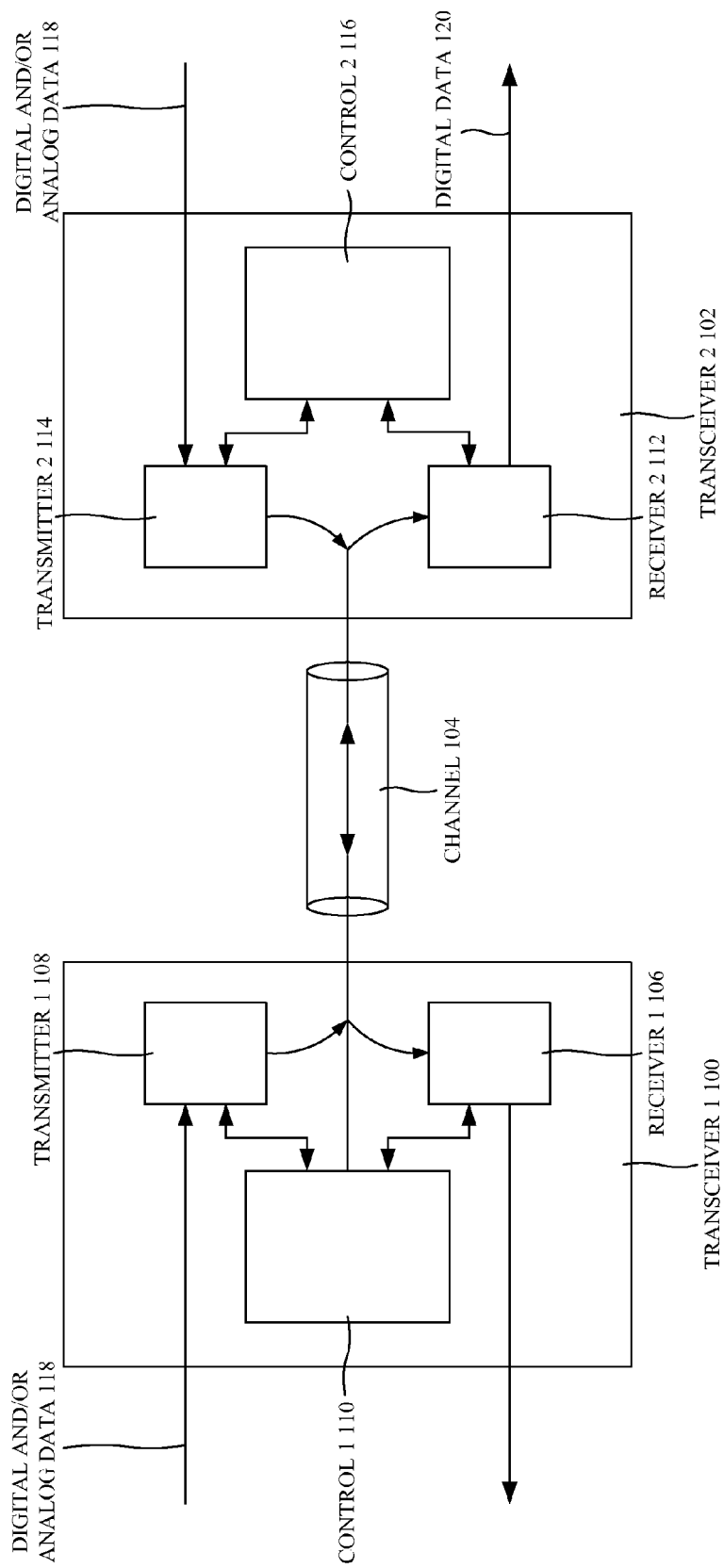
FIG. 1 is a schematic diagram of a transceiver 1, including a transmitter 1, a receiver 1 and a control 1, communicating with a transceiver 2 including a transmitter 2, a receiver 2 and a control 2, through a channel, according to one embodiment.

FIG. 1 is a schematic diagram of a transceiver 1 (e.g., a circuit 100), including a transmitter 1 (e.g., a circuit 108), a receiver 1 (e.g., a circuit 106) and a control 1 (e.g., a circuit 110), communicating with a transceiver 2 (e.g., a circuit 102) including a transmitter 2 (e.g., a circuit 114), a receiver 2 (e.g., a circuit 112) and a control 2 (e.g., a circuit 116), through a channel (e.g., a channel 104), according to one embodiment. The transceiver (e.g., transceiver 1 100 or transceiver 2 102) may be a hardware or a firmware (e.g. a software running on an integrated circuit). The transmitter (e.g., transmitter 1 108 or transmitter 2 114) may be a hardware or a firmware which may receive an analog or digital input data and may perform operations of modulation, encryption, and/or encoding before transmitting the data as an analog waveform through the channel. The receiver (e.g. receiver 1 106 or receiver 2 112) may be a hardware or a firmware and may perform operations of sampling, demodulation, decryption, and/or decoding on a received data after transmission through the channel. A channel (e.g., a channel 104) may be a medium of data transmission (e.g., intra-chip interconnect, inter-chip interconnect, optical fiber).

Figure 2:
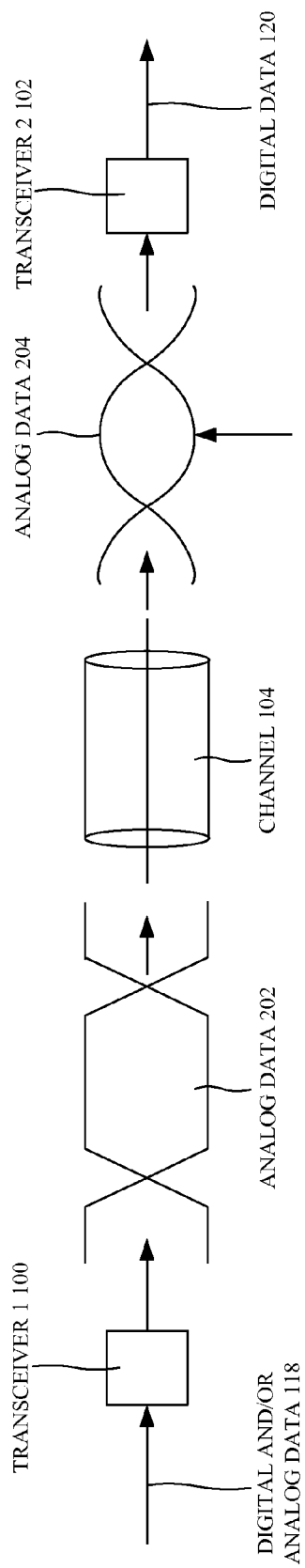
FIG. 2 is a schematic diagram showing transmission of a transmitted digital and/or analog data by the transceiver 1 of FIG. 1 and a received digital data by the transceiver 2 of FIG. 1, according to one embodiment.

FIG. 2 is a schematic diagram showing transmission of a transmitted digital and/or analog data (e.g., 118 of FIG. 1 and FIG. 2) by the transceiver 1 of FIG. 1 and a received digital data (e.g., 120 of FIG. 1 and FIG. 2) by the transceiver 2 of FIG. 1, according to one embodiment.

The transceiver may accept a digital and/or an analog data (e.g. 118 of FIG. 2). A transmitted analog data (e.g., 202 of FIG. 2) may be an encoded, encrypted and/or modulate version of the accepted data (e.g. 118 of FIG. 2). While transmission through the channel, the transmitted analog data may suffer distortions (e.g., a noise and/or an inter symbol interference). A received analog data may be a modulated voltage waveform received by the transceiver 2. An eye opening (e.g., as illustrated in FIG. 2) may be a shape of the modulated voltage waveform of a received analog data. An ideal position of clock edge (e.g., as illustrated in FIG. 2) may be an optimal temporal location of the logically critical voltage transition edge of the clock. Distortions added by the channel while transmission may reduce the eye opening (e.g., as illustrated in FIG. 2) in the received analog data (e.g., 204 of FIG. 2). In order to optimally sample the received analog data, it may be required to position the logically critical voltage transition edge of the clock at the center of the eye opening (as illustrated in FIG. 2).

Figure 3:
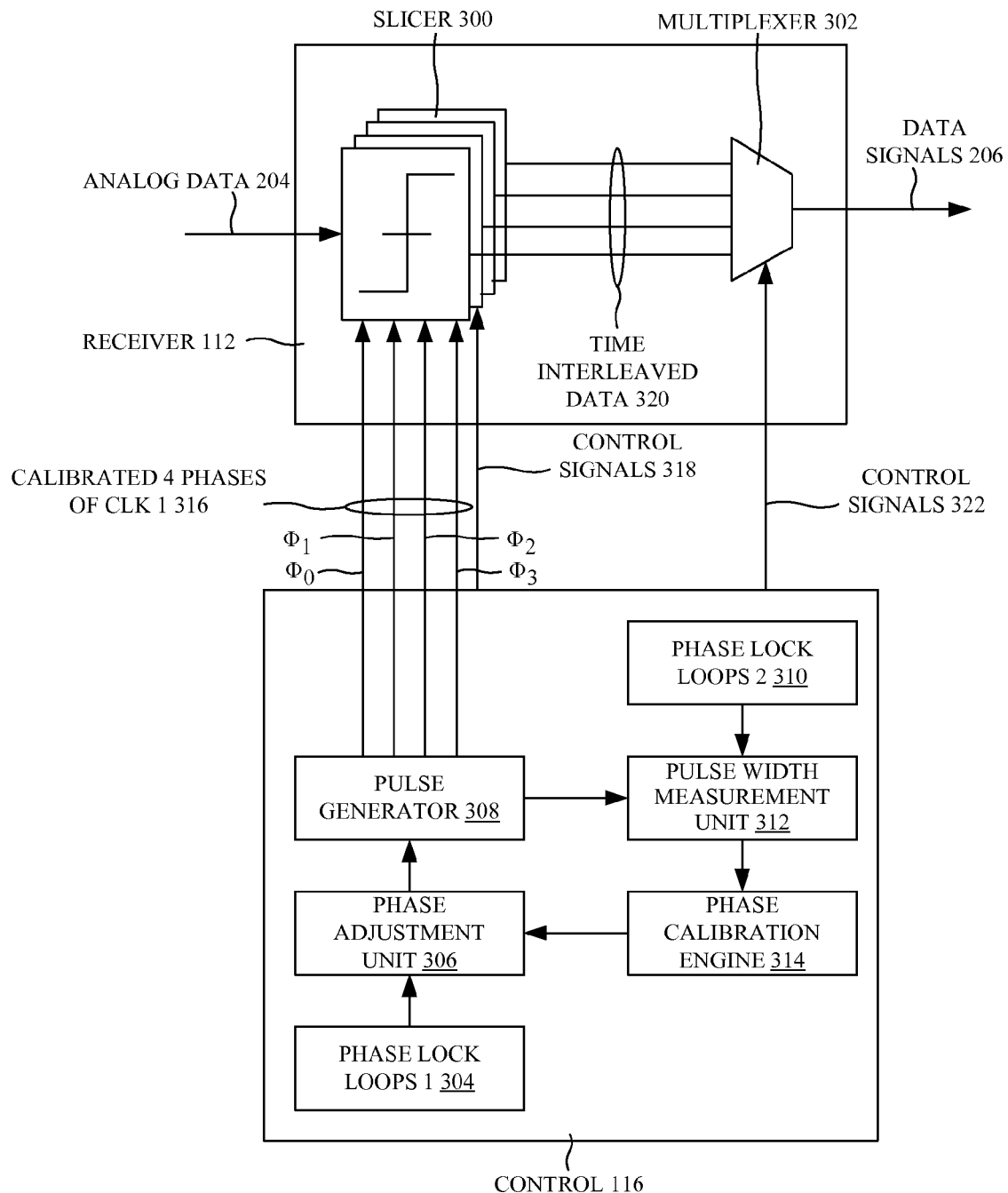
FIG. 3 is an exploded view diagram highlighting coupling of control signals and data signals between the receiver of FIG. 1 and the control of FIG. 1, according to one embodiment.

FIG. 3 is an exploded view diagram highlighting coupling of control signals (e.g., 318 and 322) and data signals (e.g., 204, 206, and 320) between the receiver of FIG. 1 and the control of FIG. 1, according to one embodiment. A slicer (e.g., 300) may be a hardware (e.g., an integrated circuit) to sample the received analog data (e.g., 204). A multiplexer (e.g. 302) may be a hardware (e.g., an integrated circuit) to multiplex a time interleaved data (e.g., 320). The time interleaved data (e.g. 320) may be a set of 4 voltage waveform comprising a time skewed data. Phase lock loops (e.g. PLL 1 304 and PLL2 310) may be hardwares to generate clock signals. A phase adjustment unit (e.g., 306) may be a module comprising a bank of phase interpolators to adjust a phase in clock signals. A pulse generator (e.g. 308) may be a hardware to generate pulsed signals by logically combining multiple phases of a multi phase signal. A pulse width measurement unit (e.g. 312) may be a module to evaluate a pulse width and/or to count a duty cycle of the pulsed signals. A phase calibration engine (e.g., 314) may be a module to evaluate an amount of phase adjustment required in the clock. Calibrated 4 phases of clk1 (e.g., 316) may be a set of 4 voltage waveforms including calibrated phases. The control signals (e.g., 318 and 322) may be the voltages sent by the control unit to the slicer (e.g., 300) or to the multiplexer (e.g., 302).

Figure 4:
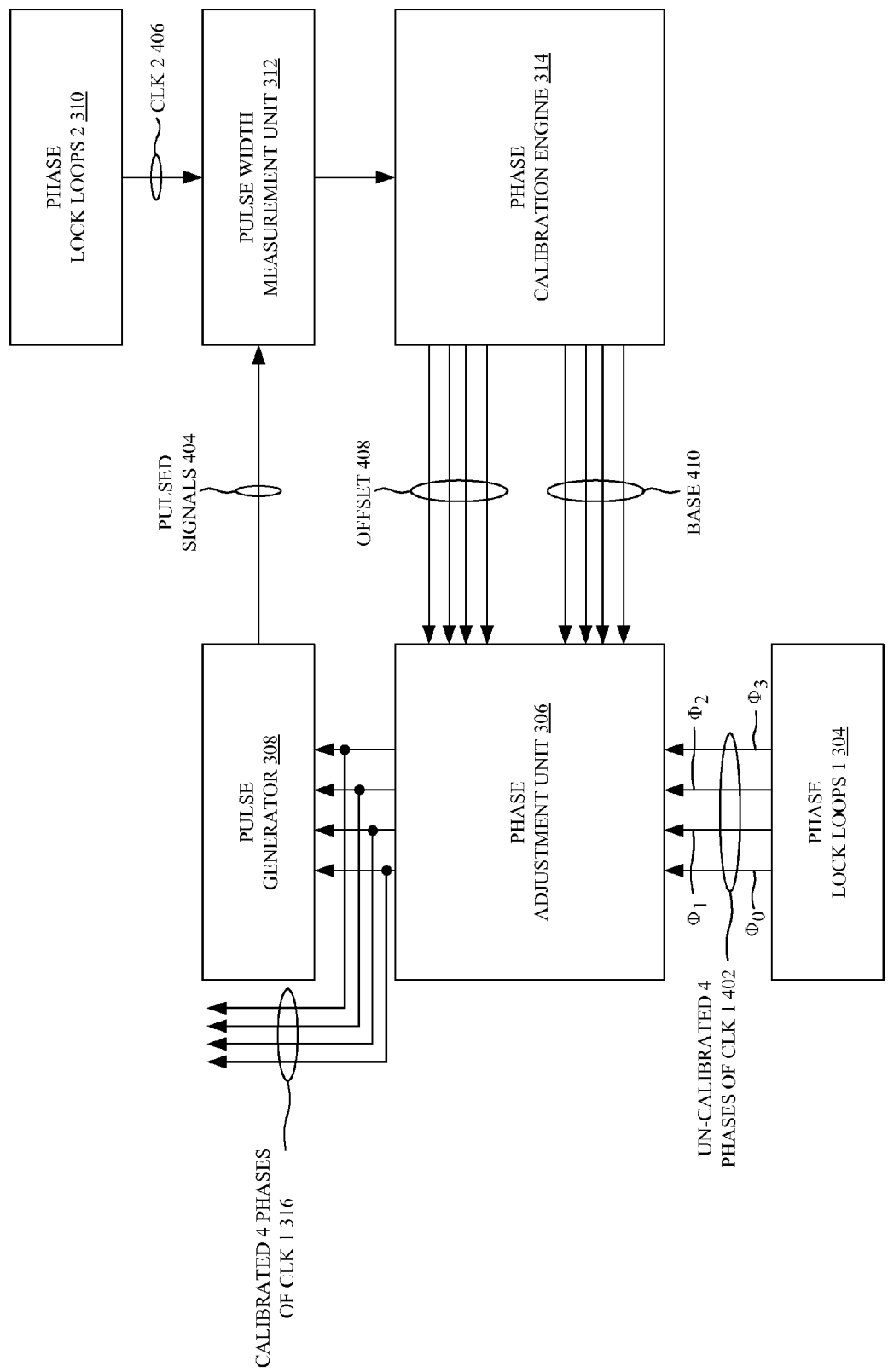
FIG. 4 is an exploded view diagram highlighting generation of a set of calibrated 4 phases of clk1 from a set of un-calibrated 4 phases of clk1 in the control of FIG. 1, according to another embodiment.

FIG. 4 is an exploded view diagram highlighting generation of a set of calibrated 4 phases of clk1 (e.g. 316 of FIG. 3 and FIG. 4) from a set of un-calibrated 4 phases of clk1 (e.g. 402) in the control of FIG. 1, according to another embodiment. The set of un-calibrated 4 phases of clk1 (e.g. 402) may be a set of 4 periodically repeating voltage waveforms generated by the PLL 1 (e.g., 304). Pulsed signals (e.g., 404) may be a set of 4 signals generated by the pulse generator (308) by logically combining 4 phases of the multiphase signal. A clk 2 (e.g., 406) may be a periodically repeating voltage waveform generated by the PLL2 (e.g., 310). A offset (e.g., 408) and a base (e.g. 410) each may be a set of 4 data streams generated by the phase calibration engine (e.g., 314) and sent to the phase adjustment unit (e.g., 306).

Figure 5:
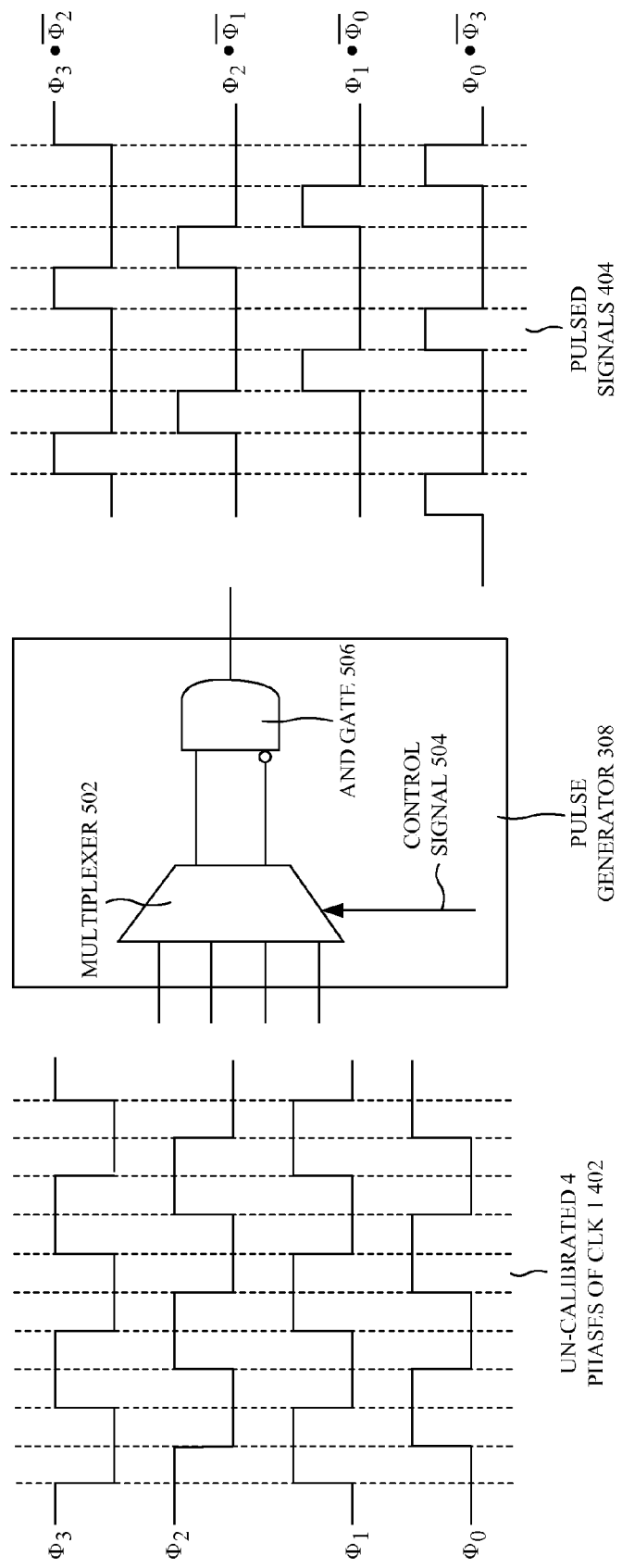
FIG. 5 is an exploded view diagram highlighting generation of a set of pulsed signals from the set of un-calibrated 4 phases of clk1 using a pulse generator of FIG. 4, according to another embodiment.

FIG. 5 is an exploded view diagram highlighting generation of a set of pulsed signals (e.g. 404 of FIG. 4 and FIG. 5) from the set of un-calibrated 4 phases of clk1 using a pulse generator of FIG. 4, according to another embodiment. The pulse generator (e.g., 308) may comprise a multiplexer (e.g., 502) and an AND gate (e.g., 506). The multiplexer (e.g., 502) may be a hardware to select any two out of 4 input signals. A control signal (e.g., 504) may be a voltage signal that may dictate which of the 2 signals may be selected. The AND gate (e.g., 506) may be an integrated circuit.

Figure 6:
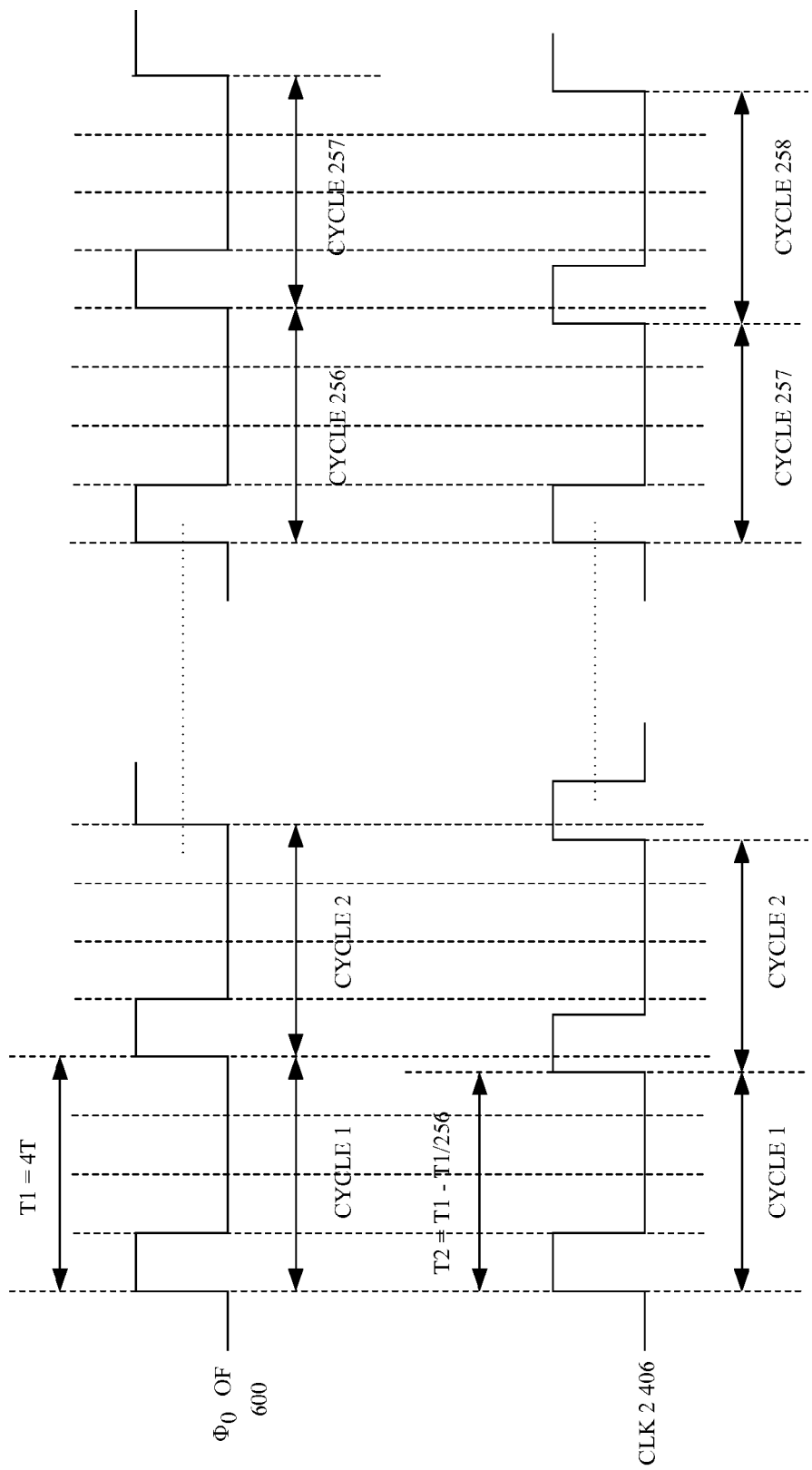
FIG. 6 is a schematic diagram highlighting a relative temporal position of a low voltage to high voltage transition edge in $\Phi_0$ of clk1 of FIG. 5 and the low voltage to high voltage transition edge in a clk2 of FIG. 5, according to another embodiment.

FIG. 6 is a schematic diagram highlighting a relative temporal position of a low voltage to high voltage transition edge in $\Phi_0$ of clk1 of FIG. 5 and the low voltage to high voltage transition edge in a clk2 of FIG. 5, according to another embodiment. A $\Phi_0$ of clk1 (e.g., 600) may be one signal of the set of un-calibrated 4 phases of clk 1 (e.g., 402 of FIG. 4).

In one embodiment, a communication system includes the transmitter (e.g., the transmitter 1 108 of FIG. 1) communicating the multiple-phase time-interleaved data (e.g., 320 of FIG. 3) with a predetermined data-symbol-rate with at least one receiver (e.g., the receiver 2 112 of FIG. 1) which includes a bank of data slicers (e.g., the slicer 300 of FIG. 3) and the data multiplexer (e.g., the multiplexer 302 of FIG. 3) coupled to the control unit (e.g., the control 2 116 of FIG. 1); a first-PLL (e.g., the PLL 1 304 of FIG. 3 and FIG. 4) of the control unit to generate the set of un-calibrated multiple-phase signals of a first-clock each with a predetermined repetition rate of the first-clock-frequency; a second-PLL (e.g., the PLL 2 310 of FIG. 3 and FIG. 4), the pulse generator (e.g., a circuit 308 of FIGS. 3-5), the pulse-width measurement unit (e.g., a circuit 312 of FIG. 3 and FIG. 4) and the phase calibration engine (e.g., the phase calibration engine 314 of FIG. 3 and FIG. 4) of the control unit to evaluate adjustments required in the temporal location of the logically critical voltage transition edge in each signal in the set of un-calibrated multiple-phase signals of the first-clock (e.g., signals 402 of FIG. 4); and the phase adjustment unit (e.g., a circuit 306 of FIG. 3 and FIG. 4) of the control unit to adjust the temporal location of the logically critical voltage transition edge in each signal in the set of un-calibrated multiple-phase signals of the first-clock to generate a set of calibrated multiple-phase signals of the first-clock (e.g., signals 316 of FIG. 3 and FIG. 4) to control the bank of data slicers and the data multiplexer of the receiver such that each signal in the set of calibrated multiple-phase signals of the first-clock includes the logically critical voltage transition edge which is time skewed in a predetermined amount from the logically critical voltage transition edge in other signals in the same set within a predetermined accuracy.

In another embodiment, the control unit includes the first-PLL (e.g., the PLL 1 304 of FIG. 3 and FIG. 4) to generate the set of un-calibrated multiple-phase signals of the first-clock (e.g., signals 402 of FIG. 4) such that each signal in the set of un-calibrated multiple-phase signals of the first-clock has the periodic repetition rate of the first-clock-frequency of the first-clock and includes the logically critical voltage transition edge; the second-PLL to generate the second-clock (e.g., clk2 406 of FIG. 4) with the second-clock-frequency which is different from the first-clock-frequency in the predetermined amount; the pulse generator (e.g., a circuit 308 of FIGS. 3-5) to logically combine (e.g., as illustrated in FIG. 5) the signals in the set of un-calibrated multiple-phase signals of the first-clock to generate a set of pulsed signals (e.g., pulsed signals 404 of FIG. 5); the pulse-width measurement unit to measure a pulse width of the signals in the set of pulsed signals utilizing plurality of time periods the second-clock; the phase calibration engine to evaluate adjustments required in the temporal location of the logically critical voltage transition edge in each signal in the set of un-calibrated multiple-phase signals of the first-clock; and the phase adjustment unit to adjust the temporal location of the logically critical voltage transition edge in each signal in the set of un-calibrated multiple-phase signals of the first-clock to generate the set of calibrated multiple-phase signals of the first-clock such that each signal in the set of calibrated multiple-phase signals of the first-clock includes the logically critical voltage transition edge which is time skewed in the predetermined amount from the logically critical voltage transition edge in other signals in the same set within the predetermined accuracy.

To optimally sample the received analog data, it may be required to position the logically critical voltage transition edges in all 4 phases of the first clock to be 90 degrees apart. The pulse generator (e.g., 308 of FIGS. 3-5) may operate on the 4 phases of the first clock to generate 4 pulsed signals (e.g., as illustrated in FIG. 5). Control signal (e.g., 504 of FIG. 5) may be used to control the multiplexer (e.g., 502 of FIG. 5) select a combination of two phases of the first clock which then in turn may be passed to the AND gate (e.g., 506 of FIG. 5) to generate one of the 4 pulsed signals.

A duty cycle of each of the 4 pulsed signals (e.g. 404 of FIG. 4) may be counted by the pulse width measurement unit (e.g. 312 of FIG. 3 and FIG. 4). The phase calibration engine (e.g., 314 of FIG. 3 and FIG. 4) may average the 4 values of duty cycles to obtain a target value. The phase calibration engine may in turn evaluate the adjustments required in the temporal location of the logically critical voltage transition edge in each signal in the set of un-calibrated multiple-phase signals of the first-clock. This required adjustment may be communicated by the phase calibration engine to the phase adjustment unit (e.g., 306 of FIG. 3 and FIG. 4) using a set of two data (e.g., a base 410 of FIG. 4 and an offset 408 of FIG. 4). The phase adjustment unit may include a set of 4 phase interpolators which in turn may adjust phases based on the set of two data provided by the phase calibration engine to generate calibrated 4 phases of the first clock.

In one embodiment, the first PLL may generate un-calibrated, approximately equally spaced, 4 phases (e.g. $\Phi_0$, $\Phi_1$, $\Phi_2$ and $\Phi_3$ of FIG. 4) of the first-clock (e.g. clk 1 of FIG. 6) each with the first-clock-frequency of 1.5 GHz and a time period of 66.66 ns (e.g., T1 in FIG. 6) which may be four times a data symbol time period (e.g., T in FIG. 6). The control unit may use the set of calibrated multiple-phase signals of the first-clock to sample a received data stream at a repetition rate of 6 Gbps.

In one embodiment, the control unit may include the second-PLL which may generate the second-clock with a time period of 62.25 ns (e.g., T2 in FIG. 6) which may be smaller as compared to the time period of the first-clock (e.g., as illustrated in FIG. 6). The control unit may use the plurality of time periods (e.g., 256) of the second-clock to sample and evaluate a waveform of each signal in the set of un-calibrated multiple-phase signals of the first-clock with a resolution of 256th part of a time period of the first-clock (e.g., as illustrated in FIG. 6). In one embodiment, the logically critical voltage transition edge of successive 256 time periods of the second clock (e.g. clk 2 of FIG. 6) may scan a full wave-shape of one time period of each phase (e.g., $\Phi_0$ of clk 1 of FIG. 6) of the first clock (e.g., as illustrated in FIG. 6). This may be used by the phase calibration engine to evaluate the duty cycle and the required phase adjustments of each of the phases.

In one embodiment, the phase adjustment unit of the control unit may include a set of 4 phase interpolator each adjusting the temporal location of the logically critical voltage transition edge in one of the 4 signals in the set of un-calibrated multiple-phase signals of the first-clock to one temporal location of a set of 64 possible temporal locations. The phase adjustment unit may include the set of 64 possible temporal locations which are substantially equally spaced within a quarter of a period of the first-clock.

Figure 7:
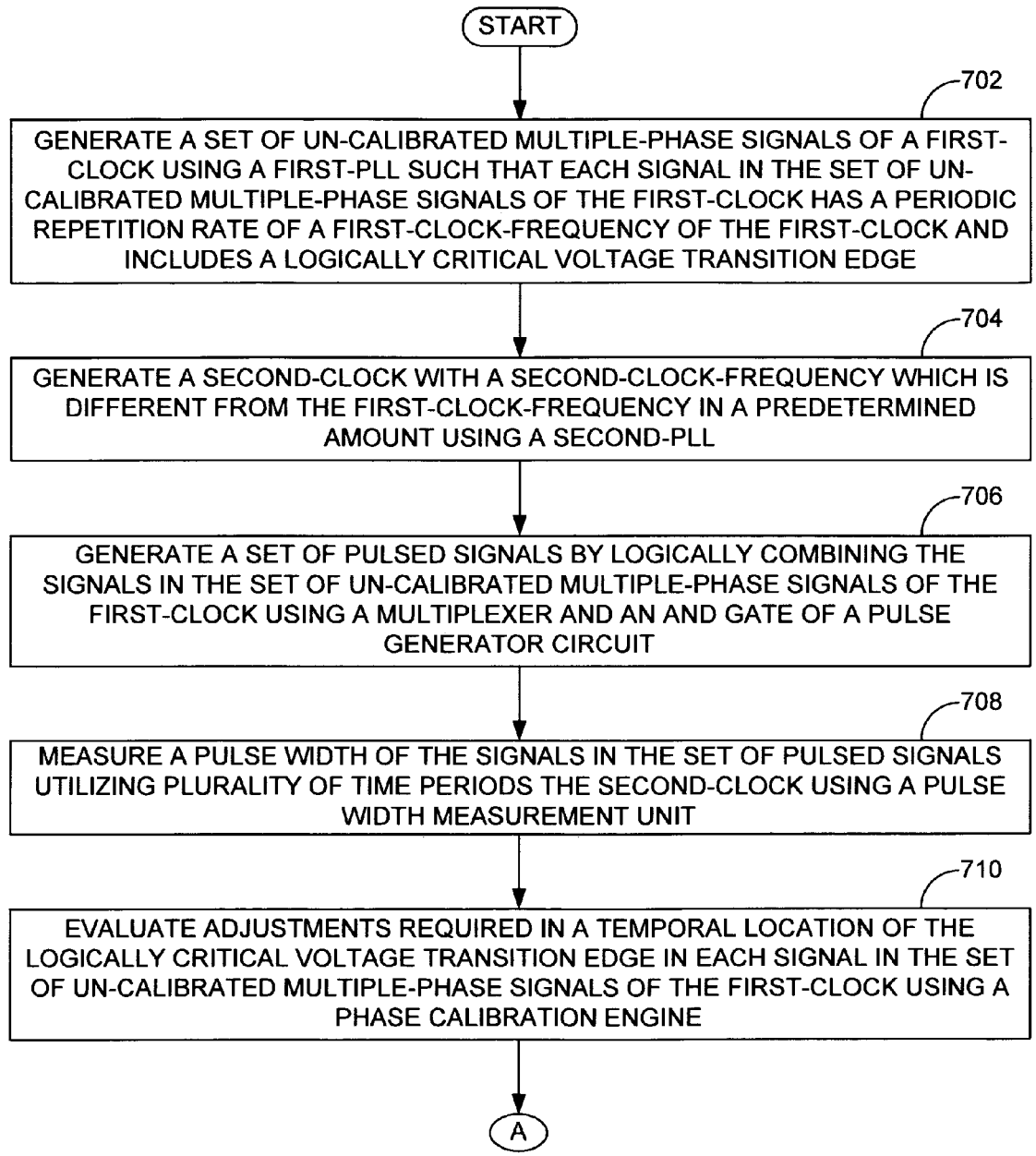
FIG. 7 is a process flow of generating a set of calibrated multiple-phase signals of a first-clock from a set of un-calibrated multiple-phase signals of the firstclock according to the one embodiment and/or the another embodiment.

FIG. 7 is a process flow of a duty cycle counting phase calibration scheme of an I/O interface, according to one embodiment. In operation 702, a set of un-calibrated multiple-phase signals of a first-clock may be generated using a first-PLL (e.g., the PLL 1 304 of FIGS. 3-4) such that each signal in the set of un-calibrated multiple-phase signals of the first-clock (e.g., the un-calibrated 4 phase of clk 1 402 of FIGS. 4, 5) has a periodic repetition rate of a first-clock-frequency of the first-clock and includes a logically critical voltage transition edge. In operation 704, a second-clock (e.g., the CLK 2 406 of FIGS. 4, 6) may be generated with a second-clock-frequency which is different from the first-clock-frequency in a predetermined amount using a second-PLL (e.g., the PLL 2 310 of FIGS. 3-4).

In operation 706, a set of pulsed signals may be generated by logically combining the signals in the set of un-calibrated multiple-phase signals of the first-clock (e.g., the un-calibrated 4 phase of clk 1 402 of FIGS. 4, 5) using a multiplexer (e.g., the multiplexer 302, 502 of FIGS. 3, 5) and an AND gate (e.g., the AND gate 506 of FIG. 5) of a pulse generator circuit (e.g., the pulse generator 308 of FIGS. 3, 4, 5)

In operation 708, a pulse width of the signals in the set of pulsed signals (e.g., the pulsed signals 404 of FIGS. 4, 5) may be measured by utilizing plurality of time periods the second-clock using a pulse width measurement unit (e.g., the pulse width measurement unit 312 of FIGS. 3, 4).

In operation 710, adjustments required in a temporal location of the logically critical voltage transition edge in each signal in the set of un-calibrated multiple-phase signals of the first-clock (e.g., the un-calibrated 4 phase of clk 1 402 of FIGS. 4, 5) may be evaluated by using a phase calibration engine (e.g., the phase calibration engine 314 of FIGS. 3, 4).

Figure 8:
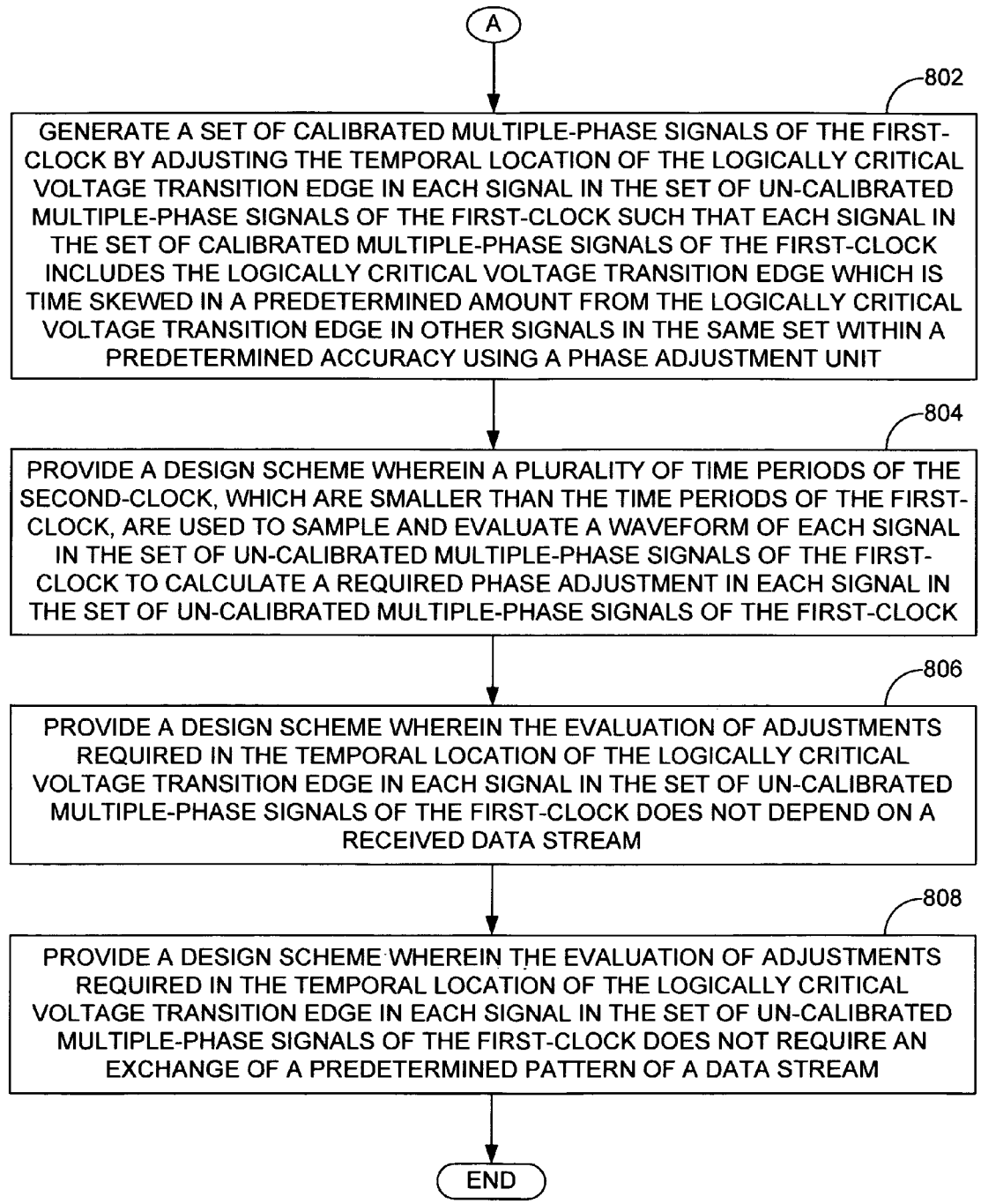
FIG. 8 is a process flow of generating a set of calibrated multiple-phase signals of a first clock according to one embodiment and/or another embodiment.

FIG. 8 is a process diagram that describes further the operations of FIG. 7, according to one embodiment. In operation 802, a set of calibrated multiple-phase signals of the first-clock (e.g., the calibrated 4 phase of clk 1 316 of FIGS. 3, 4) may be generated by adjusting the temporal location of the logically critical voltage transition edge in each signal in the set of un-calibrated multiple-phase signals of the first-clock (e.g., the un-calibrated 4 phase of clk 1 402 of FIGS. 4, 5) such that each signal in the set of calibrated multiple-phase signals of the first-clock (e.g., the calibrated 4 phase of clk 1 316 of FIGS. 3, 4) includes the logically critical voltage transition edge which is time skewed in a predetermined amount from the logically critical voltage transition edge in other signals in the same set within a predetermined accuracy using a phase adjustment unit.

In operation 804, a design scheme may be provided wherein a plurality of time periods of the second-clock (e.g., the CLK 2 406 of FIGS. 4, 6), which are smaller than the time periods of the first-clock, are used to sample and evaluate a waveform of each signal in the set of un-calibrated multiple-phase signals of the first-clock (e.g., the un-calibrated 4 phase of clk 1 402 of FIGS. 4, 5) to calculate a required phase adjustment in each signal in the set of un-calibrated multiple-phase signals of the first-clock (e.g., the un-calibrated 4 phase of clk 1 402 of FIGS. 4, 5).

In operation 806, a design scheme may be provided wherein the evaluation of adjustments required in the temporal location of the logically critical voltage transition edge in each signal in the set of un-calibrated multiple-phase signals of the first-clock (e.g., the un-calibrated 4 phase of clk 1 402 of FIGS. 4, 5) does not depend on a received data stream. In operation 808, a design scheme may be provided wherein an algorithm used in the phase calibration engine (e.g., the phase calibration engine 314 of FIGS. 3, 4) in the receiver is substantially similar to an algorithm used in the transmitter (e.g., the transmitter 1-2 108, 114 of FIG. 1).

In yet another embodiment, a method includes generating the set of un-calibrated multiple-phase signals of the first-clock using the first-PLL such that each signal in the set of un-calibrated multiple-phase signals of the first-clock has the periodic repetition rate of the first-clock-frequency of the first-clock and includes the logically critical voltage transition edge; generating the second-clock (e.g., clk2 406 of FIG. 4) with the second-clock-frequency which is different from the first-clock-frequency in the predetermined amount using a second-PLL; generating the set of pulsed signals by logically combining the signals in the set of un-calibrated multiple-phase signals of the first-clock using a multiplexer (e.g., a circuit 502 of FIG. 5) and the AND gate (e.g., the AND gate 506 of FIG. 5) of the pulse generator circuit; measuring the pulse width of the signals in the set of pulsed signals utilizing plurality of time periods the second-clock using the pulse width measurement unit; evaluating adjustments required in the temporal location of the logically critical voltage transition edge in each signal in the set of un-calibrated multiple-phase signals of the first-clock using the phase calibration engine; and generating the set of calibrated multiple-phase signals of the first-clock by adjusting the temporal location of the logically critical voltage transition edge in each signal in the set of un-calibrated multiple-phase signals of the first-clock such that each signal in the set of calibrated multiple-phase signals of the first-clock includes the logically critical voltage transition edge which is time skewed in the predetermined amount from the logically critical voltage transition edge in other signals in the same set within the predetermined accuracy using the phase adjustment unit.

Although the present embodiments have been described with reference to specific example embodiments, it will be evident that various modifications and changes may be made to these embodiments without departing from the broader spirit and scope of the various embodiments. For example, the various devices, modules, analyzers, generators, etc. described herein may be enabled and operated using hardware circuitry (e.g., CMOS based logic circuitry), firmware, software and/or any combination of hardware, firmware, and/or software (e.g., embodied in a machine readable medium). For example, the various electrical structure and methods may be embodied using transistors, logic gates, and electrical circuits (e.g., application specific integrated ASIC circuitry and/or in Digital Signal; Processor DSP circuitry).

In addition, it will be appreciated that the various operations, processes, and methods disclosed herein may be embodied in a machine-readable medium and/or a machine accessible medium compatible with a data processing system (e.g., a computer system), and may be performed in any order. Accordingly, the specification and drawings are to be regarded in an illustrative rather than a restrictive sense.

What is claimed is:

1. A communication system comprising:
a transmitter communicating a multiple-phase time-interleaved data with a predetermined data-symbol-rate with at least one receiver which includes a bank of data slicers and a data multiplexer coupled to a control unit;
a first-PLL of the control unit to generate a set of un-calibrated multiple-phase signals of a first-clock each with a predetermined repetition rate of the first-clock-frequency;
a second-PLL, a pulse generator, a pulse-width measurement unit and a phase calibration engine of the control unit to evaluate adjustments required in a temporal location of a logically critical voltage transition edge in each signal in the set of un-calibrated multiple-phase signals of the first-clock; and
a phase adjustment unit of the control unit to adjust the temporal location of the logically critical voltage transition edge in each signal in the set of un-calibrated multiple-phase signals of the first-clock to generate a set of calibrated multiple-phase signals of the first-clock to control the bank of data slicers and the data multiplexer of the receiver such that each signal in the set of calibrated multiple-phase signals of the first-clock includes the logically critical voltage transition edge which is time skewed in a predetermined amount from the logically critical voltage transition edge in other signals in the same set within a predetermined accuracy.

2. The system of claim 1 wherein the data-symbol-rate is 4 times the first-clock-frequency.

3. The system of claim 2 wherein a second-clock generated by the second-PLL has a periodic repetition rate of secondclock-frequency which is different from the first-clock-frequency in a predetermined amount of approximately 0.2%.

4. The system of claim 3 wherein a plurality of time periods of the second-clock are used to evaluate a phase offset in each signal in the set of un-calibrated multiple-phase signals of the first-clock.

5. The system of claim 4 wherein the evaluation of adjustments required in the temporal location of the logically critical voltage transition edge in each signal in the set of un-calibrated multiple-phase signals of the first-clock does not depend on a received data stream.

6. The system of claim 5 wherein a predetermined pattern in the received data stream is not required to evaluate of adjustments in the temporal location of the logically critical voltage transition edge in each signal in the set of un-calibrated multiple-phase signals of the first-clock.

7. The system of claim 6 wherein an algorithm used in the phase calibration engine in the receiver is substantially similar to an algorithm used is the transmitter.

8. The system of claim 7 wherein a phase offset caused by a voltage controlled oscillator, a clock tree and a phase interpolator is adjusted by the control unit.

9. A control unit comprising:
a first-PLL to generate a set of un-calibrated multiple-phase signals of a first-clock such that each signal in the set of un-calibrated multiple-phase signals of the first-clock has a periodic repetition rate of a first-clock-frequency of the first-clock and includes a logically critical voltage transition edge;
a second-PLL to generate a second-clock with a second-clock-frequency which is different from the first-clock-frequency in a predetermined amount;
a pulse generator to logically combine the signals in the set of un-calibrated multiple-phase signals of the first-clock to generate a set of pulsed signals;
a pulse-width measurement unit to measure a pulse width of the signals in the set of pulsed signals utilizing plurality of time periods of the second-clock;
a phase calibration engine to evaluate adjustments required in a temporal location of the logically critical voltage transition edge in each signal in the set of un-calibrated multiple-phase signals of the first-clock; and
a phase adjustment unit to adjust the temporal location of the logically critical voltage transition edge in each signal in the set of un-calibrated multiple-phase signals of the first-clock to generate a set of calibrated multiple-phase signals of the first-clock such that each signal in the set of calibrated multiple-phase signals of the first-clock includes the logically critical voltage transition edge which is time skewed in a predetermined amount from the logically critical voltage transition edge in other signals in the same set within a predetermined accuracy.

10. The control unit of claim 9 in which the first PLL generates un-calibrated, approximately equally spaced, 4 phases of the first-clock each with the first-clock-frequency of 1.5 GHz.

11. The control unit of claim 10 in which the set of calibrated multiple-phase signals of the first-clock is used to sample a received data stream at a repetition rate of 6 Gbps.

12. The control unit of claim 11 in which the second-PLL generates the second-clock with a time period of 62.25 ns which is smaller as compared to the time period of the first-clock.

13. The control unit of claim 12 in which the plurality of time periods of the second-clock is used to sample and evaluate a waveform of each signal in the set of un-calibrated multiple-phase signals of the first-clock with a resolution of 256th part of a time period of the first-clock.

14. The control unit of claim 13 in which the phase adjustment unit comprises a set of 4 phase interpolator each adjusting the temporal location of the logically critical voltage transition edge in one of the 4 signals in the set of un-calibrated multiple-phase signals of the first-clock to one temporal location of a set of 64 possible temporal locations.

15. The control unit of claim 14 in which the phase adjustment unit in which the set of 64 possible temporal locations are substantially equally spaced within a quarter of a period of the first-clock.

16. A method, comprising:
generating a set of un-calibrated multiple-phase signals of a first-clock using a first-PLL such that each signal in the set of un-calibrated multiple-phase signals of the first-clock has a periodic repetition rate of a first-clock-frequency of the first-clock and includes a logically critical voltage transition edge;
generating a second-clock with a second-clock-frequency which is different from the first-clock-frequency in a predetermined amount using a second-PLL;
generating a set of pulsed signals by logically combining the signals in the set of un-calibrated multiple-phase signals of the first-clock using a multiplexer and an AND gate of a pulse generator circuit;
measuring a pulse width of the signals in the set of pulsed signals utilizing plurality of time periods the second-clock using a pulse width measurement unit;
evaluating adjustments required in a temporal location of the logically critical voltage transition edge in each signal in the set of un-calibrated multiple-phase signals of the first-clock using a phase calibration engine; and
generating a set of calibrated multiple-phase signals of the first-clock by adjusting the temporal location of the logically critical voltage transition edge in each signal in the set of un-calibrated multiple-phase signals of the first-clock such that each signal in the set of calibrated multiple-phase signals of the first-clock includes the logically critical voltage transition edge which is time skewed in a predetermined amount from the logically critical voltage transition edge in other signals in the same set within a predetermined accuracy using a phase adjustment unit.

17. The method of claim 16 wherein a plurality of time periods of the second-clock, which are smaller than the time periods of the first-clock, are used to sample and evaluate a waveform of each signal in the set of un-calibrated multiple-phase signals of the first-clock to calculate a required phase adjustment in each signal in the set of un-calibrated multiple-phase signals of the first-clock.

18. The method of claim 17 wherein the evaluation of adjustments required in the temporal location of the logically critical voltage transition edge in each signal in the set of un-calibrated multiple-phase signals of the first-clock does not depend on a received data stream.

19. The method of claim 18 wherein the evaluation of adjustments required in the temporal location of the logically critical voltage transition edge in each signal in the set of un-calibrated multiple-phase signals of the first-clock does not require an exchange of a predetermined pattern of a data stream.

20. The method of claim 19 wherein an algorithm used in the phase calibration engine in a receiver is substantially similar to an algorithm used in the transmitter.

* * * * *